United States Patent
Zhang et al.

[11] Patent Number: 6,020,674
[45] Date of Patent: Feb. 1, 2000

[54] TORSIONAL ELECTROSTRICTIVE ACTUATORS

[75] Inventors: Oiming Zhang; Leslie E. Cross, both of State College, Pa.; Chulho Kim, Burke; Manfred Kahn, Alexandria, both of Va.

[73] Assignee: The Penn State Research Foundation, University Park, Pa.

[21] Appl. No.: 08/961,999

[22] Filed: Oct. 31, 1997

[51] Int. Cl.[7] .................................................. H01L 41/08
[52] U.S. Cl. .................... 310/333; 310/337; 310/358; 310/369
[58] Field of Search .................. 310/332, 333, 310/337, 358, 359, 366, 369

[56] References Cited

U.S. PATENT DOCUMENTS

| | | | |
|---|---|---|---|
| 2,828,470 | 3/1958 | Mason | 310/333 X |
| 2,838,695 | 6/1958 | Thurston | 310/333 X |
| 2,838,696 | 6/1958 | Thurston | 310/333 X |
| 2,880,334 | 3/1959 | Mason | 310/333 X |
| 3,035,126 | 5/1962 | Crownover | 310/333 |
| 3,219,850 | 11/1965 | Langevin | 310/333 |
| 3,842,294 | 10/1974 | Doi et al. | 310/333 |
| 4,025,805 | 5/1977 | Coltma | 310/337 X |

OTHER PUBLICATIONS

"Piezoelectric Torsional Actuator", Fuda et al., Ferroelectrics, vol. 160, pp. 323–330 (1994).

*Primary Examiner*—Mark O. Budd
*Attorney, Agent, or Firm*—Thomas J. Monahan

[57] ABSTRACT

A torsional actuator includes a plurality of segments, each segment having a substantially rectangular shape. Each segment is comprised of an electroactive material that is poled along an elongated dimension of the rectangular shape. The segments are arranged side-by-side, with adjacent segments poled in opposing directions along their long dimensions. Conductors are positioned between adjacent sides of the side-by-side segments, with all of the juxtaposed segments being bound together in an integral structure. A power supply is connected to the conductors and applies oppositely poled electric fields across adjacent segments to cause like shear deformations of each of the segments and a resultant angular rotation of a non-fixed end thereof.

5 Claims, 5 Drawing Sheets

TORSIONAL ELECTROSTRICTIVE ACTUATORS

GOVERNMENT SPONSORSHIP

This invention was made with Government support under Contract No. N00014-92-J-1510 awarded by the U.S. Department of the Navy. The Government has certain rights in the invention.

FIELD OF THE INVENTION

This invention relates to the use of electroactive ceramic materials as actuators and, more particularly, to the use of the piezoelectric shear effect of piezoelectric ceramics to provide torsional actuation about an axis.

BACKGROUND OF THE INVENTION

Electroactive (e.g., piezoelectric) ceramics are intrinsically capable of generating only small strains. Various strain or electric field amplification devices, such as bimorphs or multi-layer actuators enhance the capabilities of such materials and enable the achievement of large linear displacements up to the millimeter level, with high force levels. In contrast, no similar electroactive devices are capable of generating large angular displacements (i.e. twists) with similar torque outputs.

For example, typical piezoelectric materials, such as lead zirconate titanate-based ceramics (PZTs) have a piezoelectric shear coefficient $d_{15}$ in the range of 300 to 700 pm/V. The shear strain or twist angle produced by use of these materials is on the order of 0.02°, when a material having a $d_{15}$ coefficient of 700 pm/V and an electric field E of 5 kV/cm is used. Such an angular displacement is too small for most practical applications.

Fuda et al. in "Piezoelectric Torsional Actuator", *Ferroelectrics,* 1994, Volume 160, pages 323–330, describe a piezoelectric torsional actuator which utilizes a single ceramic cylinder comprised of a PZT material. The key feature of the cylindrical actuator is an interdigital electrode network on the outer surface of the cylinder wherein the interdigitated electrodes are oriented at an angle of 45° from the length axis of the cylinder. When the cylinder wall thickness and the ratio between electrode width and pitch are kept constant, Fuda et al. report that the rotational angle is approximately proportional to the electric field. Fuda et al. further report that the rotational angle of such a PZT cylindrical construct is inversely proportional to the diameter of the piezoelectric cylinder.

Because the torsional movement of the Fuda et al. piezoelectric cylinder makes use of the combined effects of the $d_{33}$ and the $d_{31}$ piezoelectric coefficients, the available torsional strain is small (on the order of microradians).

Currently, there is a need for torsional actuators for control of local and global twist in helicopter rotor blades, as control surface actuators for adaptive wings and in further air-moving applications such as turbo prop blades and unducted fan engine control mechanisms. There is thus a need for a solid state torsional actuator which can achieve substantial angular rotational displacements with relatively high torque values.

Accordingly, it is an object of this invention to provide an improved torsional actuator which makes use of electroactive materials.

It is another object of this invention to provide an improved torsional actuator that enables high torque angular displacements to be achieved.

It is a further object of this invention to provide an improved torsional actuator that makes use of the $d_{15}$ piezoelectric shear coefficient, since it is known that the $d_{15}$ coefficient is greater than either of the $d_{31}$ or $d_{33}$ piezoelectric coefficients.

SUMMARY OF THE INVENTION

A torsional actuator includes a plurality of segments, each segment having a substantially rectangular shape. Each segment is comprised of a piezoelectric ceramic material that is poled along an elongated dimension of the rectangular shape. The segments are arranged side-by-side, with adjacent segments poled in opposing directions along their long dimensions. Conductors are positioned between adjacent sides of the side-by-side segments, with all of the juxtaposed segments being bound together in an integral structure. A power supply is connected to the conductors and applies oppositely poled electric fields across adjacent segments to cause like shear deformations of each of the segments and a resultant angular rotation of a non-fixed end thereof.

DETAILED DESCRIPTION OF THE INVENTION

The preferred electroactive material for use with the invention is a lead, zirconate, titanate (PZT) piezoelectric ceramic. However, it is to be understood that any other electroactive material which exhibits at least equivalent characteristics to a PZT material may be utilized in the torsional actuators to be described below. Such electroactive materials may include other ceramic piezoelectric materials, single crystal piezoelectric materials and polymeric piezoelectric materials.

Figure 1:
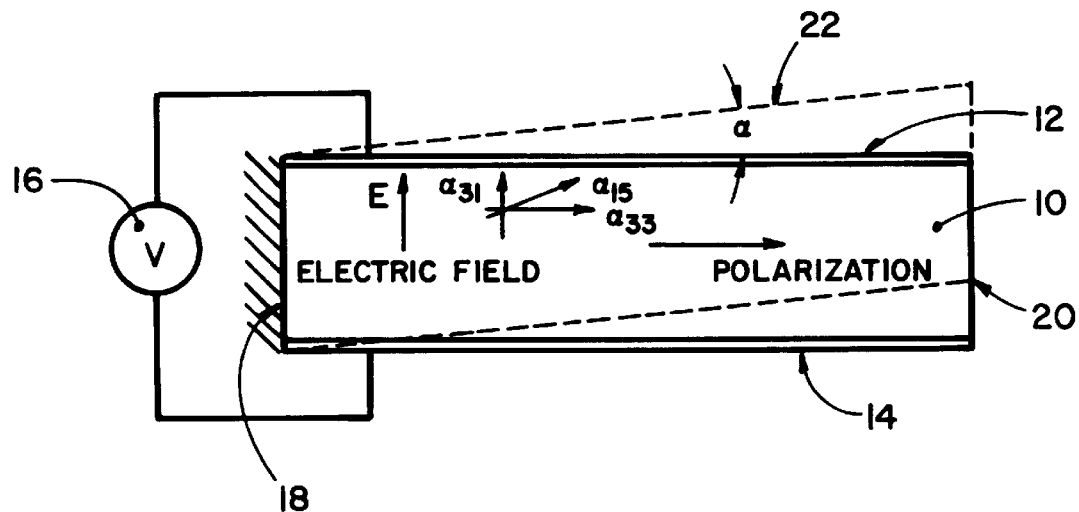
FIG. 1 is a schematic diagram illustrating the effects of an applied voltage across an electroactive (e.g., piezoelectric) ceramic segment.

Referring to FIG. 1, a rectangular segment of a PZT piezoelectric ceramic 10 includes conductors 12 and 14 adhered to its upper and lower edges, respectively. A power supply 16 applies a voltage between electrodes 12 and 14 and creates an electric field E across the shorter dimension of PZT segment 10. Prior to application of electric field E, PZT segment 10 has been polarized along its longer dimension by application of a high potential between ends 18 and 20.

When power supply 16 applies a DC potential between electrodes 12 and 14, a shear deflection is produced by the $d_{15}$ piezoelectric response, causing PZT segment 10 to deform in the manner shown by dashed line 22. If only one PZT segment 10 is employed, the angle of deflection α will only be approximately 0.02° for a PZT under an electric field of 5 kV/cm, ($d_{15}$=740 pm/V).

Figure 2:
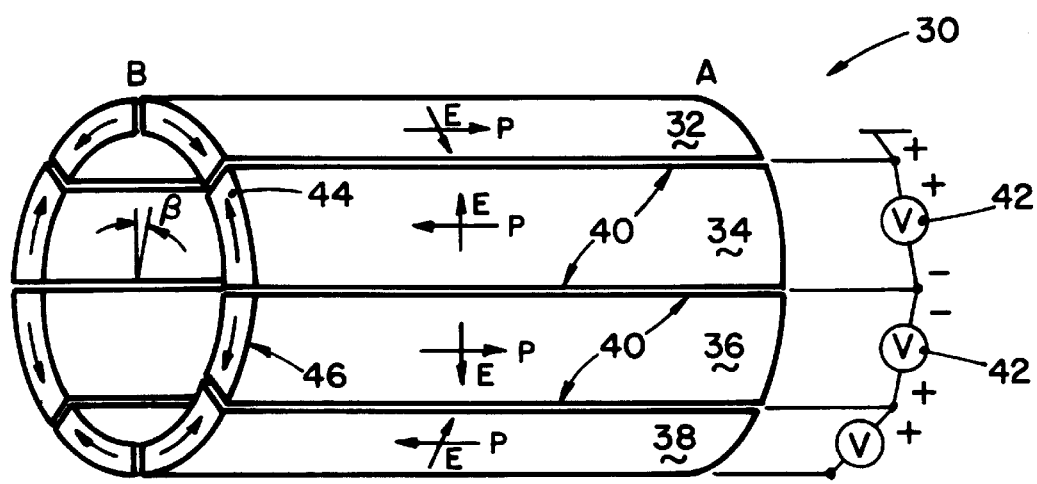
FIG. 2 illustrates a perspective view of a first-embodiment of a torsional actuator incorporating the invention.

Referring now to FIG. 2, a first embodiment of a torsional PZT actuator embodying the invention will be described wherein angular twists of several degrees can be accomplished. Torsional actuator 30 comprises a plurality of substantially rectangular PZT segments 32, 34, 36, 38 . . . etc. which are collectively formed into a cylindrical shape. The PZT segments preferably have a length to width ratio that is much greater than one. Electrodes 40 are positioned between each of the adjoining PZT segments. Every other PZT segment, i.e., 32, 36, . . . etc. is poled in one direction along PZT actuator 30 and every other segment, i.e. 34, 38 . . . etc. is poled in the opposite direction. These polling states are achieved by (i) application of removable electrodes to the ends of the respective PZT segments, followed by an application of a poling voltage or by (ii) through use of a continuous poling procedure as described by Gururaja et al. in "Continuous Poling of PZT Fibers and Ribbons and its Application to New Devices", Ferroelectrics, V. 47, pp 193–200 (1983).

A voltage 42 is applied to electrodes 40 which bound each segment; however, opposed voltages are applied across adjacent electrode pairs so as to create oppositely directed electric fields across the adjacent PZT segments. Thus, assuming that end A of torsional actuator 30 is fixed, application of actuating voltages 42 to electrodes 40 about PZT segment 34 cause its free end 44 at end B to deflect upwardly as a result of the $d_{15}$ shear strain that is induced therein. In similar fashion, the oppositely poled voltage 42 applied to electrodes 40 about PZT segment 36 will cause a similar $d_{15}$ strain therein, causing end 44 to also deflect in an upward manner. While not shown, the structure of torsional actuator 30 moy be is held together by an epoxy/fiber wrap to improve its mechanical strength.

Application of oppositely poled voltages to adjacent PZT segments causes each segment to deflect and results in a counter-clockwise rotation of free end B of torsional actuator 30. The additive deflections of each PZT segment enable a substantial angular rotation of end B.

Figure 3:
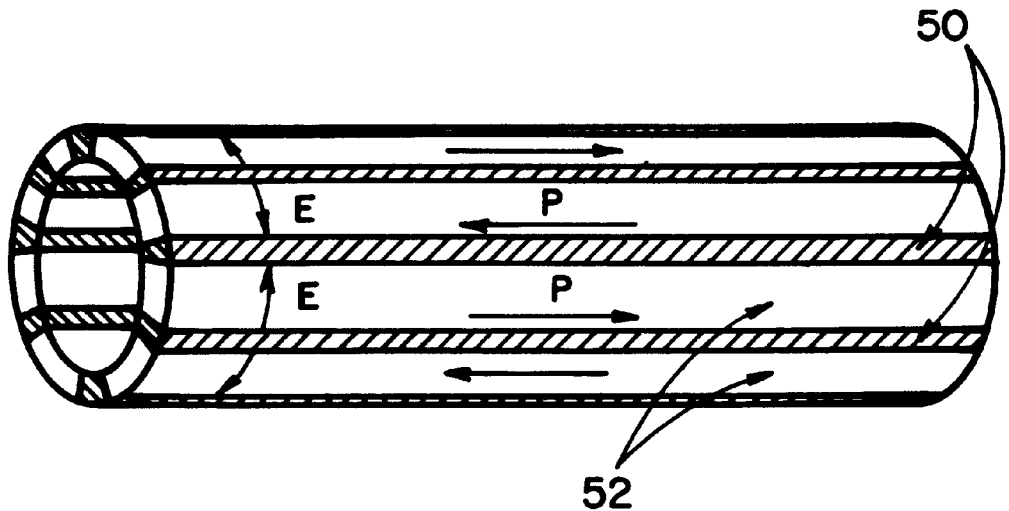
FIG. 3 is a version of the embodiment of FIG. 2 wherein individual piezoelectric segments are maintained in place by organic matrix composite materials.

FIG. 3 is a further embodiment of the actuator of FIG. 2, wherein carbon-carbon or graphite-epoxy composite inserts 50 are positioned between each of PZT segments 52. Such composite materials provide mechanical stability and frequency response, while maintaining excellent electrical contact characteristics. Provided that the composite material has a relatively low shear modulus, achieved by use of appropriate matrix materials and a low fiber volume fraction, the twist angle of the actuator of FIG. 3 will be comparable to that of the embodiment of FIG. 2. Similarly, the torque output of the actuator of FIG. 3 will also be comparable to that of the actuator shown in FIG. 2. However, it is to be understood that the torque output is primarily a function of the quantity of active PZT ceramic material in the composite actuator assembly.

Figure 4:
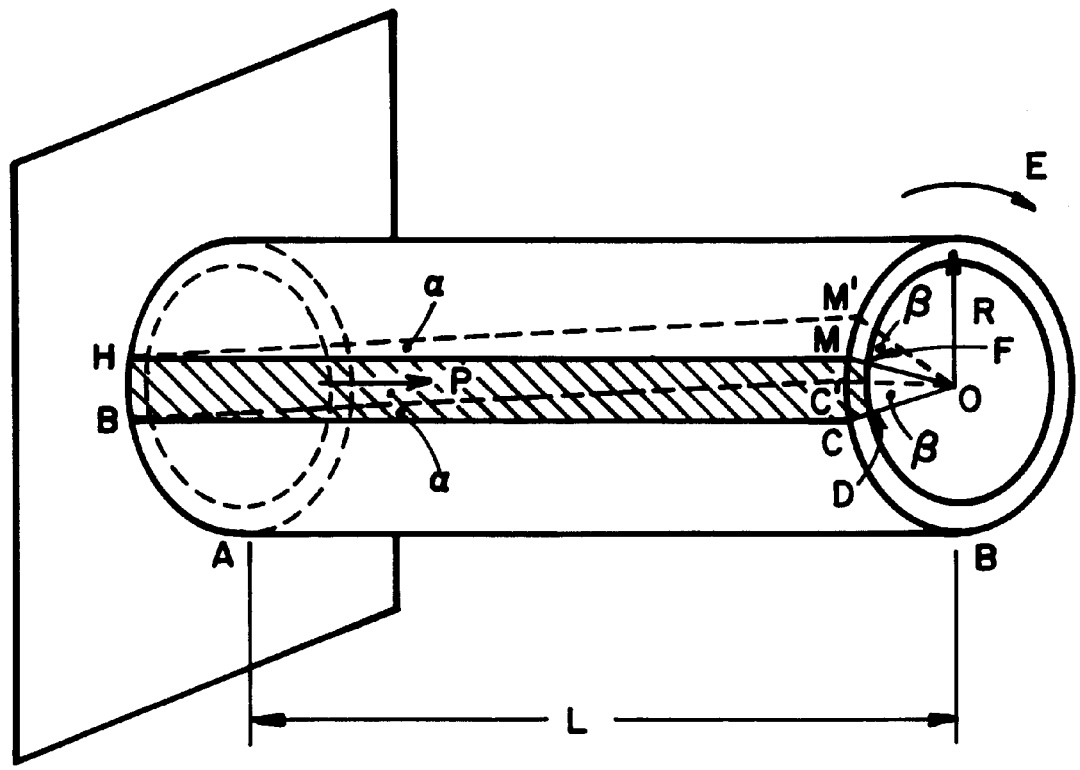
FIG. 4 is a schematic diagram illustrating the action of the torsional actuator of FIG. 2 in response to actuating voltages.
Figure 5:
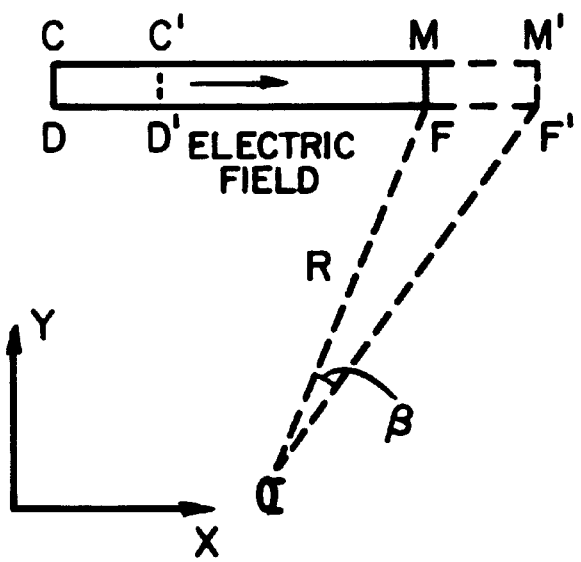
FIG. 5 is a schematic diagram illustrating the rotative deflection of the free end of the actuator of FIG. 4.

Turning to FIGS. 4 and 5, an analysis of the action of the torsional actuators of FIGS. 2 and 3 will be presented. Considering an actuation of one segment, as shown in FIG. 1, an electric field will produce a shear strain which will cause a deflection of an amount α therein. When such a segment is incorporated in a cylindrical structure as shown in FIG. 4, a rotation angle β is produced at the end CDFM in the end plane of the cylinder. Such a deflection is illustrated, schematically, in FIG. 5 where application of an electric field causes element CD to move to C', D' and element MF to move to M', F'. The rotation angle β can be measured from point O in accordance with the following expression:

$$\beta = F \cdot F'/R = L \cdot \alpha / R \quad (1)$$

If L is greater than R, β will be greater than α and an angular amplification is achieved. Thus, it can be seen, with respect to a schematic illustration of FIG. 4, that β is the rotation angle of end B, assuming end A is fixed. It is also to be noted from the above expression, that the greater the ratio of L to R, the greater the angular amplification that is achieved.

Figure 6:
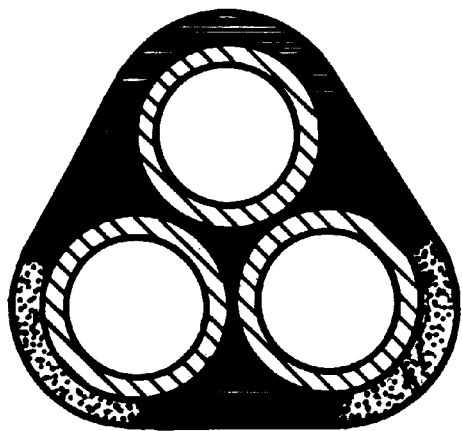
FIG. 6 is an end view of a triple cylinder embodiment of the invention.
Figure 7:
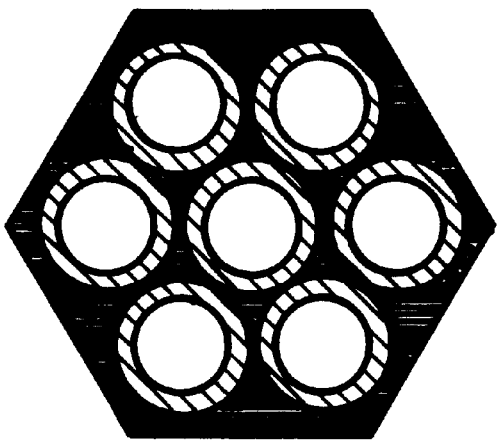
FIG. 7 is an end view of a seven cylinder embodiment of the invention.

If there are restrictions on the length L of the torsional actuator, a multi-cylinder composite structure may be utilized to increase the angular displacement and torque outputs of actuator. Referring to FIGS. 6 and 7, a pair of composite torsional actuator structures are illustrated. In FIG. 6, instead of utilizing a single cylindrical torsional actuator with a large radius R, a three cylindrical arrangement is utilized wherein the exterior about each of the torsional actuator cylinders has been filled with a compliant material and then subsequently wrapped to achieve a unitary structure. FIG. 6 illustrates a three-cylinder arrangement and FIG. 7 a seven-cylinder arrangement.

For the composite three-cylindrical structure, expression 1 above is replaced by:

$$\beta = 1.85 (L \cdot \alpha / R) \quad (2)$$

Expression 2 yields about twice the angular rotation of a single cylindrical actuator, provided the radius R of each cylinder is the same for the two cases. For the seven-cylinder actuator, it can be shown that the twist angle is:

$$\beta = 5.00 (L \cdot \alpha / R) \quad (3)$$

From expressions (2) and (3), it can be concluded that an effective way to significantly increase a torsional twist angle from a PZT torsional actuator is to reduce the radius of the individual cylinders used and/or to use multi-cylinder actuators. In practice, the minimum cylinder radius that is practical, the requirement to make effective stress transfer and mechanical connections between the cylinders in a composite, and the mechanical integrity of the torsional actuator will limit the number of cylinders in the composite structure.

Figure 8:
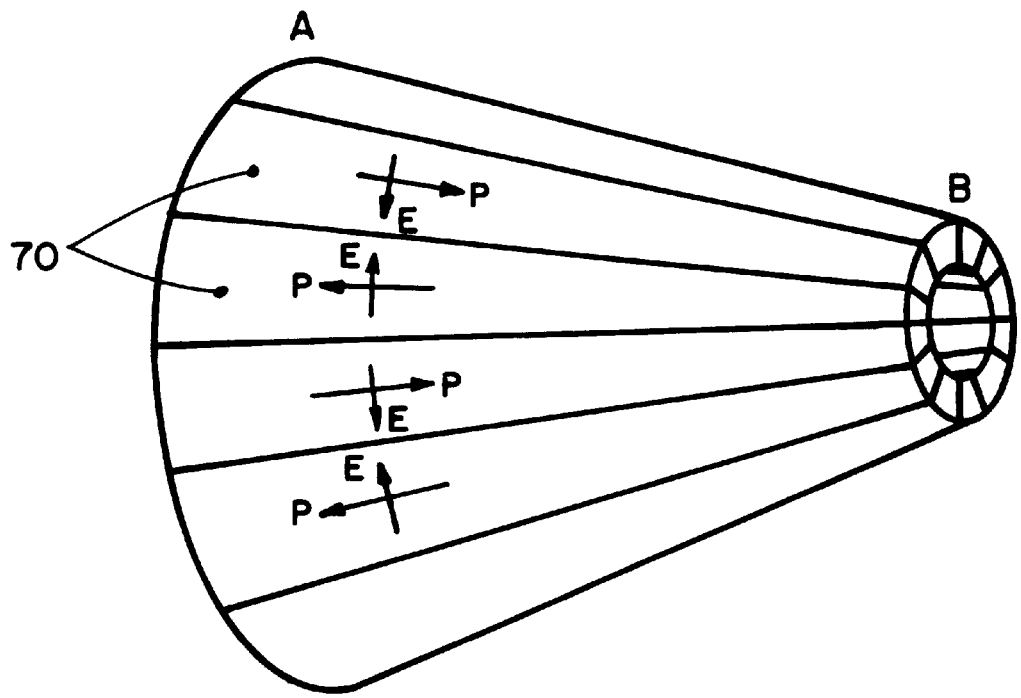
FIG. 8 is a perspective view of a conical actuator that incorporates the invention.
Figure 9:
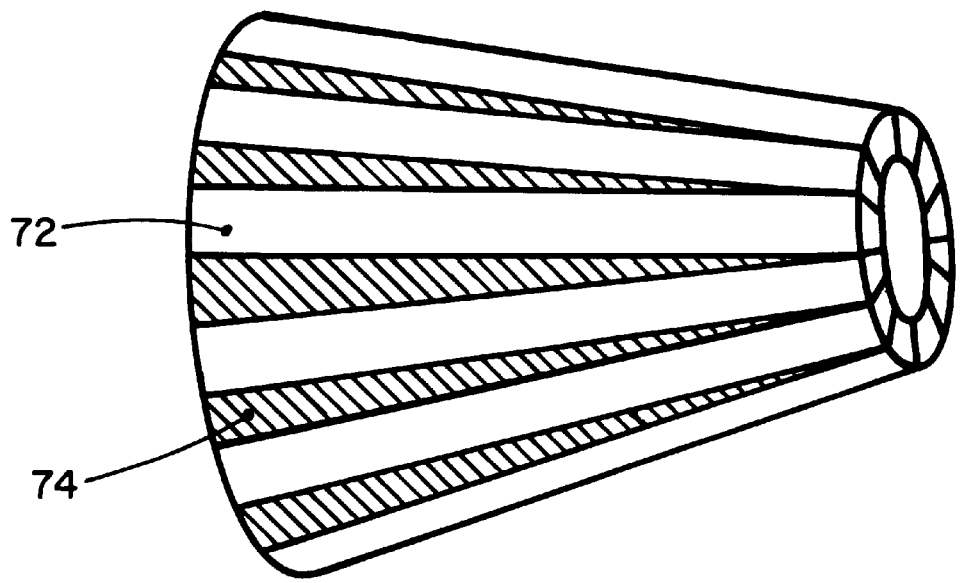
FIG. 9 illustrates the conical actuator of FIG. 8 that is comprised of a plurality of individual piezoelectric segments that are bonded together by organic matrix composite segments.

Referring to FIGS. 8 and 9, therein is shown a truncated conical version of a torsional actuator incorporating the invention. In the configuration of FIG. 8, each of PZT segments 70 still retains a substantially rectangular shape, however, the rectangular shapes are gradually truncated as they approach end B. FIG. 9 illustrates a further embodiment of the conical torsional actuator wherein substantially rectangular PZT segments 72 are employed. Regions between the edges of PZT segments 72 are filled with an organic matrix composite to provide both mechanical support and paths for electrical connections to electrodes that bound each PZT segment 72.

Figure 10:
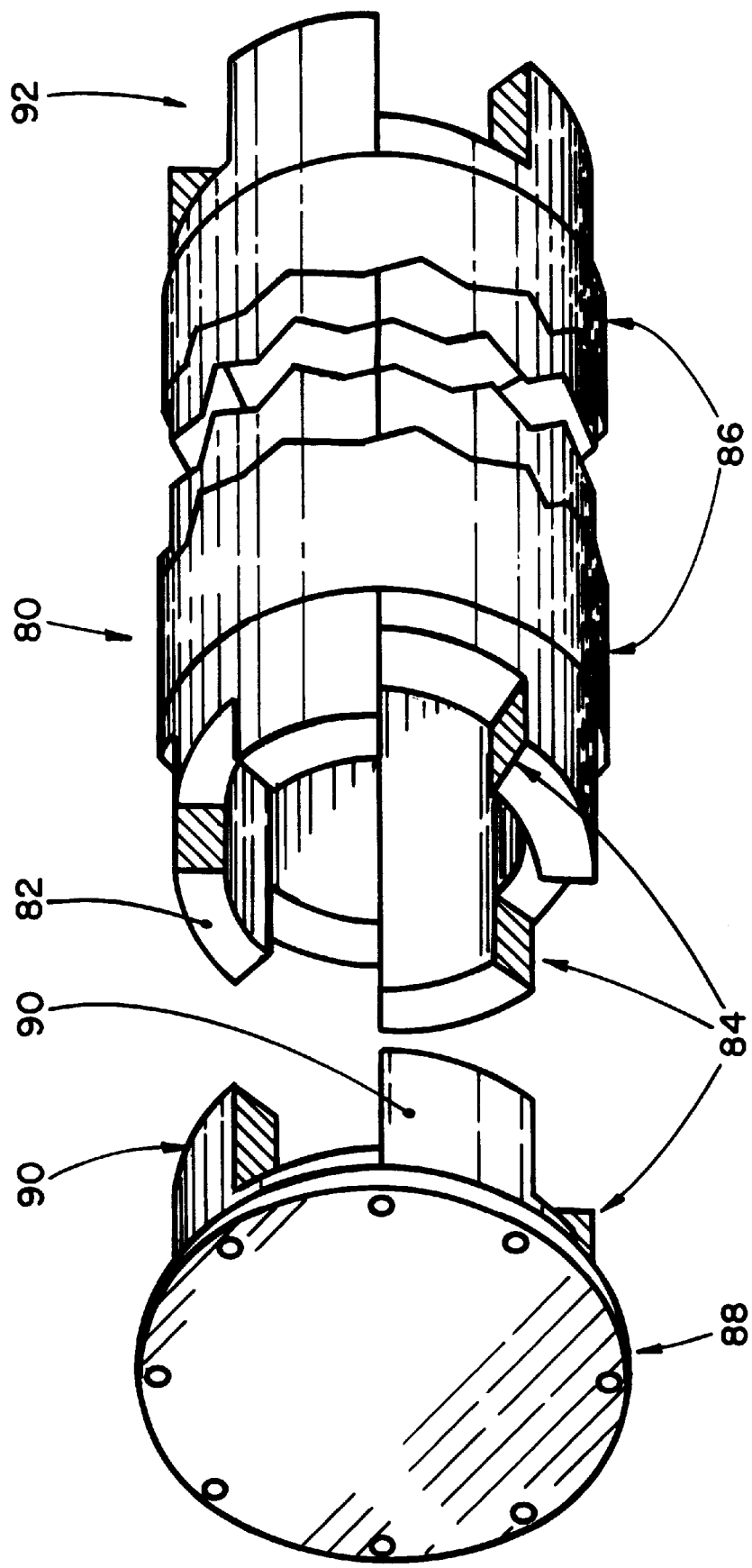
FIG. 10 is a perspective view of a torsional actuator which incorporates the embodiment of FIG. 2.

In FIG. 10, a cylindrical torsional actuator 80 is illustrated wherein PZT segments 82 are bounded by electrodes 84, with the entire cylindrical torsional actuator being wrapped by a fiberglass layer 86. A torque takeoff 88 includes fingers 90 which mate with castellated ends of PZT segments 82 to enable a torque transmission action to be provided. Opposite end 92 of torsional actuator 80 is fixed (not shown).

A torsional actuator similar to that shown in FIG. 2 was assembled with L=2.5" and R=0.5". The ceramic material was PZT-5A from the Edo Corporation, 2645 South 300 West, Salt Lake City, Utah 84115. The torsional angle of the actuator was characterized as a function of the external depoling field strength and frequency. A torsional angular rotation, under a field of 2 kV/cm of about 0.06° was observed. Since the depoling field for the material was above 4 kV/cm and there is a strong nonlinearity in the piezoelectric shear response at a field of 4 kV/cm, a torsional angle of 0.32° can be achieved. Hence, using PZT-5a for the PZT segments, an angle of more than +/−2° (total of 4°) can be achieved, with L=17.5".

The piezoelectric shear constant $d_{15}$, the dielectric constant and the shear elastic compliance were measured under a shear load. Little change was observed in the shear elastic compliance. The highest stress applied in the test was about 10 MPa. From the data taken, it was deduced that the EDo-PZT-5a actuator could generate at least 8 MPa shear stress and hence a torsional actuator having dimension R=0.5" and a thickness equal to 3 mm, could generate a torque of 2400 N*cm.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A torsional actuator comprising:
   a) a plurality of segments, each segment having a length L, each segment comprised of an electroactive material which is poled along its length dimension, said plurality of segments arranged side by side into a cylindrical cross-sectional arrangement exhibiting a radius R, wherein a ratio of L to R is a value greater than one, said ratio greater than one assuring an amplification of rotational displacement of said cylindrical cross-section in accord with said ratio, adjacent segments arranged so that their respective polings are in opposed directions;
   b) conductive means positioned between adjacent edges of said side-by-side segments;
   c) means for fixing first-ends of said side-by-side segments with respect to second ends thereof; and
   d) additional cylindrical shaped torsional actuators positioned about said torsional actuator of cylindrical shape, each of said additional cylindrical shaped torsional actuators constructed as recited in paragraphs a)–c);
   e) power supply means connected to said conductive means for applying oppositely poled electric fields across said side-by-side segments to cause shear deformations of each of said adjacent segments; and
   f) means for binding together said torsional actuator of cylindrical shape and said additional cylindrical shaped torsional actuators so as to achieve concurrent rotational movement of said second ends of each thereof.

2. The torsional actuator as recited in claim 1 wherein said electroactive material is a piezoelectric comprising lead, zirconium and titanium.

3. The torsional actuator as recited in claim 1 wherein said electroactive material is selected from the group consisting of ceramic piezoelectric materials, single crystal piezoelectric materials and polymeric piezoelectric materials.

4. The torsional actuator as recited in claim 1 wherein said conductive means comprises a conductor incorporated into a composite polymeric material.

5. The torsional actuator as recited in claim 1 wherein said second ends are arranged to engage an object to be rotatively moved.

* * * * *